(12) United States Patent
Hanson et al.

(10) Patent No.: US 8,288,253 B1
(45) Date of Patent: Oct. 16, 2012

(54) $IN_xGA_{1-x}AS_YP_{1-Y}$ QUATERNARY ETCH STOP FOR IMPROVED CHEMICAL RESISTIVITY OF GALLIUM ARSENIDE FIELD EFFECT TRANSISTORS

(75) Inventors: Allen W. Hanson, Cary, NC (US); Anthony Kaleta, Lowell, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 13/173,006

(22) Filed: Jun. 30, 2011

(51) Int. Cl.
*H01L 21/20* (2006.01)
*H01L 21/36* (2006.01)

(52) U.S. Cl. ......... 438/478; 438/22; 438/48; 438/167; 438/169; 257/E21.002; 257/E31.127

(58) Field of Classification Search .............. 438/22, 438/42, 47, 48, 93, 406, 455, 465, 977; 257/186, 257/200, 432, 436, 438, E21.002, E31.127
See application file for complete search history.

(56) References Cited

U.S. PATENT DOCUMENTS

| | | | |
|---|---|---|---|
| 6,060,402 A | 5/2000 | Hanson | 438/745 |
| 6,242,293 B1 | 6/2001 | Danzilio | 438/172 |
| 6,307,221 B1 | 10/2001 | Danzilio | 257/192 |
| 2004/0048404 A1* | 3/2004 | Bowen et al. | 438/22 |
| 2004/0259287 A1* | 12/2004 | Suhara | 438/93 |
| 2009/0039453 A1* | 2/2009 | Nakata | 257/432 |

* cited by examiner

*Primary Examiner* — Charles Garber
*Assistant Examiner* — Abdulfattah Mustapha
(74) *Attorney, Agent, or Firm* — Christopher P. Maiorana, PC

(57) ABSTRACT

A process for fabricating a semiconductor device. The process including (a) growing a channel layer on a buffer layer, (b) growing a barrier layer on the channel layer, (c) epitaxially growing a quaternary etch-stop layer on the barrier layer, (d) growing a first contact layer on the quaternary etch-stop layer, (e) growing a second contact layer on the first contact layer, (f) etching portions of the second contact layer to reveal a first recess surface, and (g) etching portions of the first contact layer to reveal a second recess surface. The second contact layer may be a highly doped contact layer. The second recess surface generally forms a gate region. The first and the second contact layers have a first etch rate and the quaternary etch-stop layer has a second etch rate in a chosen first etch chemistry.

17 Claims, 6 Drawing Sheets

IN$_x$GA$_{1-x}$AS$_Y$P$_{1-Y}$ QUATERNARY ETCH STOP FOR IMPROVED CHEMICAL RESISTIVITY OF GALLIUM ARSENIDE FIELD EFFECT TRANSISTORS

FIELD OF THE INVENTION

The present invention relates to transistor fabrication generally and, more particularly, to a method and/or apparatus for implementing a In$_X$Ga$_{1-X}$As$_Y$P$_{1-Y}$ quaternary etch stop for improved chemical resistivity of Gallium Arsenide (GaAs) field effect transistors (FETs).

BACKGROUND OF THE INVENTION

Gallium-arsenide (GaAs) based field effect transistors (FETs) can utilize a depletion region formed by a metal-semiconductor junction, commonly known as a Schottky junction, to modulate the conductivity of an underlying channel layer. Such devices have gained acceptance as a high performance transistor technology due to inherent physical properties of the gallium arsenide and related ternaries such as indium gallium arsenide (InGaAs). The devices are referred to by various names such as metal semiconductor field effect transistors (MESFET), high electron mobility transistors (HEMI), pseudomorphic high electron mobility transistor (pHEMT), two dimensional electron gas field effect transistors (TEGFET), and modulation doped field effect transistors (MODFET). Further details of the dynamics of charge transport in these structures can be found in Quantum Semiconductor Structures by Weisbuch, et al., 1991 by Academic Press, pages 38-55 and pages 141-154, which is incorporated herein by reference.

The basic gallium arsenide metal semiconductor field effect transistor, known as a MESFET, has the source and drain current carried via a relatively thin, highly doped, semiconductor layer referred to as the channel. The current is controlled by the gate which forms a Schottky barrier on the semiconductor, and therefore, depending upon the applied gate voltage, depletes the semiconductor layer of electrons under the gate. Other devices such as the HEMT, pHEMT, and MODFET are based on the basic principles described above. The structure of a basic HEMT is based on the heterojunction between two dissimilar materials, AlGaAs (Aluminum Gallium Arsenide) and GaAs (Gallium Arsenide), which are well known to those of ordinary skill in the art. Ordinarily, the two dissimilar materials used for the heterojunction have the same lattice constant (i.e., spacing between the atoms).

The pseudomorphic HEMT or pHEMT is a HEMT where the two dissimilar materials used for the heterojunction do not have the same lattice constant. The formation of a heterojunction with materials of different lattice constants can be achieved by using an extremely thin layer of one of the materials—so thin that the crystal lattice simply stretches to fit the other material. This technique allows the construction of transistors with larger bandgap differences than otherwise possible, giving the transistors better performance through improved carrier confinement.

Essentially, the transistor structure consists of a semi-insulating substrate on which is first grown a buffer layer of nominally unintentionally doped GaAs. An n-doped layer of gallium arsenide, or pseudomorphic indium gallium arsenide, forms the channel for the device. An n-minus layer of Al$_X$Ga$_{1-X}$As is disposed on top of the channel layer to form a proper Schottky barrier with the gate metalization. The last layer is typically a GaAs contact layer which is doped highly n-type (n-plus) to facilitate the formation of ohmic contacts to the underlying channel layer. The two ohmic contacts disposed on this layer are generally referred to as the source and the drain contacts. Access resistances associated with the source and the drain contacts and the underlying semiconductor material to the intrinsic device are typically referred to as R$_s$ and R$_d$, the source and drain resistances, respectively.

Electrons in the thin n-type Al$_x$Ga$_{1-x}$As layer move into the undoped gallium arsenide layer, forming a depleted Al$_x$Ga$_{1-x}$As layer. The electrons move into the undoped gallium arsenide layer because the heterojunction created by the two dissimilar (i.e., different band-gap) materials forms a quantum well in the conduction band on the lower band-gap gallium arsenide side. The electrons are confined in the conduction band quantum well and can move laterally with relatively low resistance due primarily to a reduction in the rate of impurity scattering. This creates a very thin layer of highly mobile conducting electrons with very high concentration. The high concentration of highly mobile conducting electrons give the channel very low resistivity (also known as high electron mobility). The very thin layer of highly mobile conducting electrons is commonly called a two-dimensional electron gas (2DEG).

Gallium Arsenide based pHEMT device performance can be significantly degraded by chemical exposure during process steps associated with manufacturing. Chemistries used to remove photoresist polymers and to provide pre-treatment of a surface prior to various steps can be responsible for such degradation. Effects, such as galvanic etching, have been documented in the open literature. The use of "rework steps," a practical reality in all manufacturing environments, results in an increase in the overall process performance variation. The problem can be particularly severe on enhancement-mode field-effect transistor (EFET) device structures, where the recess surface-to-channel spacing can become exceedingly small to insure that the device is normally off.

SUMMARY OF THE INVENTION

The present invention concerns a process for fabricating a semiconductor device. The process including (a) growing a channel layer on a buffer layer, (b) growing a barrier layer on the channel layer, (c) epitaxially growing a quaternary etch-stop layer on the barrier layer, (d) growing a first contact layer on the quaternary etch-stop layer, (e) growing a second contact layer on the first contact layer, (f) etching portions of the second contact layer to reveal a first recess surface, and (g) etching portions of the first contact layer to reveal a second recess surface. The second contact layer may be a highly doped contact layer. The second recess surface generally forms a gate region. The first and the second contact layers have a first etch rate and the quaternary etch-stop layer has a second etch rate in a chosen first etch chemistry.

The objects, features and advantages of the present invention include providing a method and/or apparatus for implementing a In$_X$Ga$_{1-X}$As$_Y$P$_{1-Y}$ quaternary etch stop for improved chemical resistivity of GaAs FETs that may (i) provide improved power performance, (ii) provide improved reproducibility, (iii) leave behind material associated with the etch-stop layer, (iv) improve noise and dispersion characteristics due to low IRV, (v) reduce an amount of undercut of a second recess etch profile, (vi) reduce variation of an un-gated region dimension, (vii) reduce sensitivity of the recess surface to subsequent chemical exposure, (viii) be used in addition to other etch-stop layers, (ix) be placed within the barrier layer or barrier/screening layer interface, (x) raise the Schottky barrier height of the device, and/or (xi) be used to fine tune gate electrode interactions with the barrier layer.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
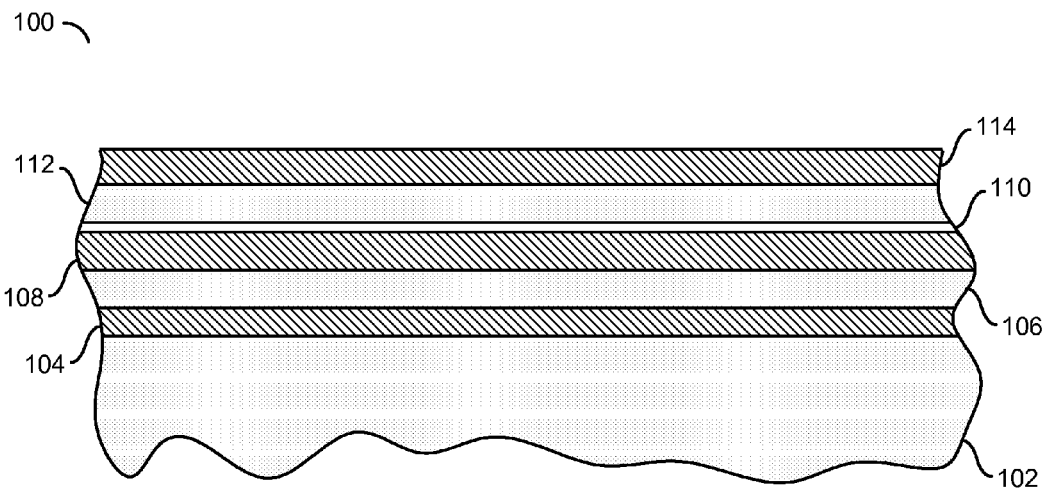
FIG. 1 is a diagram illustrating various layers of a semiconductor wafer prior to fabrication of a device in accordance with an example embodiment of the present invention.

In one example, an embodiment in accordance with the present invention may be drawn to a high-low-high gallium arsenide epitaxial field effect transistor structure. Although the disclosure of the present invention uses this special class of MESFET as an example, it is clear that to one of ordinary skill in the art, the invention of the present disclosure has applicability to epitaxial devices in which a Schottky barrier is used to control current in a channel and the common substrate material to all such devices is GaAs. Significant reductions in the intensity of labor, processing time and an overall improvement in the uniformity across a given wafer may be realized by the utilization of $In_xGa_{1-x}As_yP_{1-y}$ which may be used as the etch-stop material in the devices implemented in accordance with embodiments of the present invention.

Previous attempts with other materials such as AlAs, or more generally $Al_xGa_{1-x}As$, while exhibiting excellent selectivity to GaAs, result in increased access resistances. The increased access resistances have an adverse effect on parameters such as the maximum open channel current, knee voltage and transconductance. In contrast, the use of the $In_xGa_{1-x}P$ etch-stop generally results in a lower conduction band discontinuity at the interface with the n-minus GaAs Schottky barrier layer and results in a lower tunneling barrier to current flow, and accordingly lower access resistances to the device. This enables the benefits of the etch-stop while maintaining the performance characteristics of devices fabricated without an etch-stop which suffer the drawbacks of nonuniformity across a wafer. Values of x other than 0.5 may be chosen to minimize the misfit dislocation density as described in, J. W. Matthews, A. E. Blakeslee, Defects in epitaxial multilayers I. Misfit dislocations, J. Crystal Growth, vol. 27, pp. 118-125, 1974, the disclosure of which is incorporated herein by reference. The range of permissible values of x may vary as a function of the thickness of the etch-stop layer.

$In_xGa_{1-x}P$ presents a lower Schottky barrier height, which results in a somewhat leakier diode characteristic. The lower Schottky barrier height generally allows the device to turn on at a slightly lower voltage. Very thin etch-stop layers can perturb the electrical characteristics of the way in which the gate electrode interacts with the underlying material. Adding a quaternary etch-stop material (e.g., $In_xGa_{1-x}As_yP_{1-y}$) generally allows fine tuning of the interaction. The inclusion of arsenic (As) in the $In_xGa_{1-x}As_yP_{1-y}$ etch-stop layer can raise the Schottky barrier height back up and also increases the chemical resistivity of the etch-stop layer. The $In_xGa_{1-x}As_yP_{1-y}$ etch-stop layer reduces sensitivity of a recess surface to subsequent chemical exposure. The disposition of the $In_xGa_{1-x}As_yP_{1-y}$ etch-stop layer is not a trivial task. The growth of the $In_xGa_{1-x}As_yP_{1-y}$ layer is temperature sensitive and it is important to maintain the ratio of Arsenic to Phosphorus.

Referring to FIG. 1, a diagram is shown illustrating cross section 100 of a semiconductor wafer in accordance with an example embodiment of the present invention. The semiconductor wafer may comprise a layer 102, a layer 104, a layer 106, a layer 108, a layer 110, a layer 112, a layer 114 and a layer 116. The layer 102 may implement, in one example, a semi-insulating GaAs substrate. The layer 104 may implement, in one example, a buffer layer of unintentionally doped GaAs. The buffer layer 104 may, in one example, be epitaxially disposed on the semi-insulating GaAs substrate 102. The layer 106 may implement, in one example, a channel layer. The layer 106 may comprise, in one example, an n-doped layer of GaAs. The layer 106 may be disposed on the layer 104. In one example, the layer 106 may have a doping level on the order of $3 \times 10^{-7}$ cm$^{-3}$.

The layer 108 may implement a barrier layer. The layer 108 may be disposed on top of the layer 106. The layer 108 may comprise a layer of GaAs doped lightly n-type. In one example, the layer 108 may have a doping level on the order of $5 \times 10^{16}$ cm$^{-3}$. The layer 108 may have a thickness in the range of 200-1000 Angstroms. In a preferred embodiment, the thickness of the layer 108 may be on the order of about 430 Angstroms. The distance between a gate metallization and the channel layer 106 is generally controlled (determined) by the thickness of the layer 108, and thus the layer 108 generally plays an important role in device parameters described herein.

The layer 110 may implement a quaternary etch-stop layer. The layer 110 may be implemented, in one example, comprising Indium Gallium Arsenite Phosphide ($In_xGa_{1-x}As_yP_{1-y}$). The layer 110 may have a thickness on the order of 10-50 Angstroms. The use of $In_xGa_{1-x}As_yP_{1-y}$ for the quaternary etch-stop layer 110 may be advantageous because the metal disposed on an $In_xGa_{1-x}As_yP_{1-y}$ surface exhibits a greater barrier height to the forward conduction of electrons, or what is known to one skilled in the relevant art as the Schottky barrier height, as compared with metal disposed upon a GaAs surface. In general, a higher barrier height is one feature that may result in devices with a potentially greater maximum open channel current.

The layer 112 generally implements a first contact (or screening) layer. The layer 114 generally implements a second contact (or screening) layer. The layer 112 may be disposed on the quaternary etch-stop layer 110. The layer 112 may comprise, in one example, a continuation of the underlying barrier material used in the layer 108. The layer 114 may comprise, on one example, a highly doped layer disposed on the layer 112. The layers 112 and 114 typically comprise different materials. In one example, the layer 112 may comprises AlGaAs and the layer 114 may comprise GaAs. However, the layers 112 and 114 may be implemented with the same materials. The layer 112 spatially separates the gate electrode from the highly doped contact layer 114 and, hence, maintains a reasonable breakdown voltage for the device. The contact layer 114 is highly doped n+ to facilitate a good ohmic contact for the drain and source as described herein. The barrier layer 108, on the other hand, is lightly doped to facilitate the formation of a good Schottky barrier. The gate-to-channel spacing may be chosen to realize, among other parameters, a specific pinch-off voltage Vp.

Figure 2:
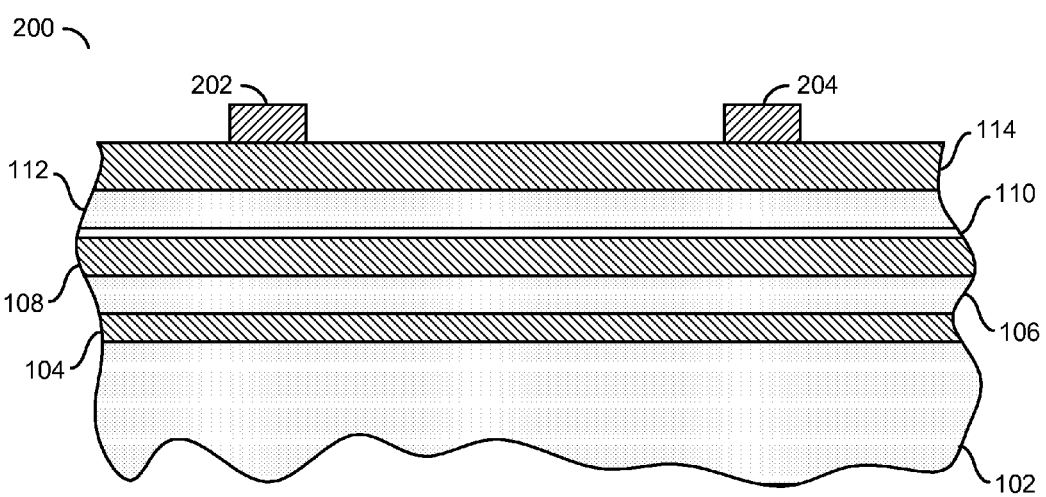
FIG. 2 is a diagram illustrating the semiconductor wafer after formation of source and drain ohmic contacts for the device.

Referring to FIG. 2, a diagram is shown illustrating a cross section 200 of the semiconductor wafer of FIG. 1 after ohmic contact formation. In general, ohmic contacts may be formed by defining areas lithographically, and then evaporating a suitable metal alloy (e.g., AuGeNiAu, etc.) followed by a subsequent lift off step of the photoresist layer. Such processing steps are well known to one of ordinary skill in the art. The final ohmic contacts may implement a contact 202 for the source and a contact 204 for the drain.

Figure 3:
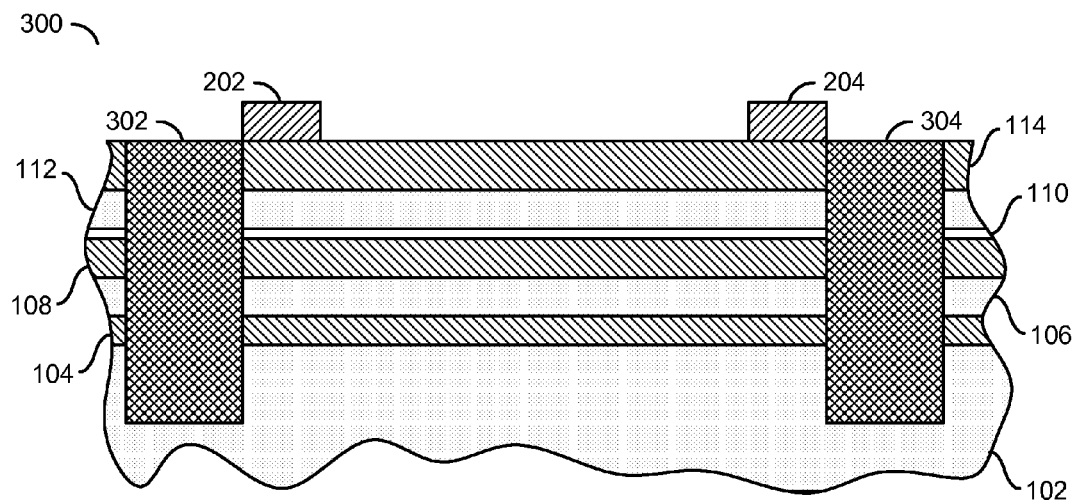
FIG. 3 is a diagram illustrating the semiconductor wafer after isolation implantation is performed in regions outside of the device lateral boundaries.

Referring to FIG. 3, a diagram is shown illustrating a cross section 300 of the semiconductor wafer of FIG. 2 after implant isolation is completed. In order to properly isolate one device on the wafer from other devices on the same die, isolation implantation may be performed in regions outside of the lateral boundaries of the device. Example isolation implantations 302 and 304 are generally shown. In one example, an implant material (e.g., a species of Boron) may be implanted in the regions that are outside the active semiconductor region to render the regions electrically inactive. Proton implantation (e.g., $H^+$) may also be employed. The implant profile generally extends into the semi-insulating GaAs substrate 102 and serves to properly isolate the device. An alternative to this method, also well known to one of ordinary skill in the art, is to perform a mesa isolation, in which the layers of the device are disposed in mesa form by etching to remove the active material from all regions outside of the device boundaries.

Figure 4:
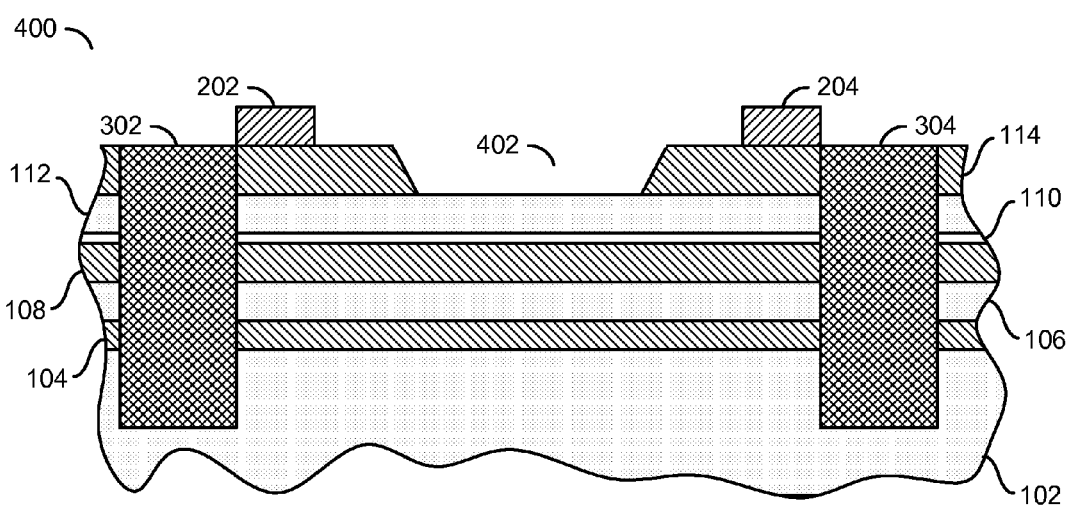
FIG. 4 is a diagram illustrating the semiconductor wafer after a first recess etch is performed to form a recess one region of the device.

Referring to FIG. 4, a diagram is shown illustrating a cross section 400 of the semiconductor wafer of FIG. 3 after performing a first recess etch to form a recess one region 402 of the device fabricated in accordance with an example embodiment of the present invention. The recess one region 402 may be defined, in one example, within an opening in a photolithographic film. The recess one region 402 may be etched to remove a selected portion of the highly doped contact layer 114. The etching of the recess one region 402 is generally not exact and may end slightly above or below the interface between the layers 112 and 114. Etching may be performed using a first etch chemistry. In one example, the first chemistry may be implemented as $H_2SO_4:H_2O_2:H_2O$ of volumetric ratio 1:8:500.

Figure 5:
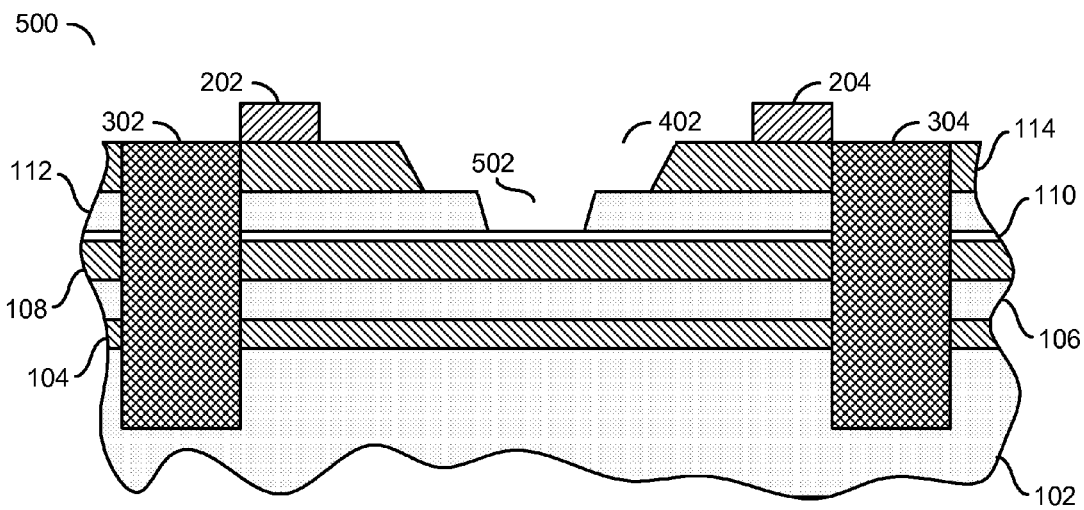
FIG. 5 is a diagram illustrating the semiconductor wafer after a second recess etch is performed to form the gate region of the device.

Referring to FIG. 5, a diagram is shown illustrating a cross section 500 of the semiconductor wafer of FIG. 4 after a second recess etch is performed to form a recess two (or gate) region 502 of the device fabricated in accordance with an example embodiment of the present invention. The recess two region 502 may be defined, in one example, within an opening in a photolithographic film. The recess two region 502 may be etched to remove a selected portion of the layer 112 prior to the deposition of the gate electrode material. Etching may be performed by using the first etch chemistry (e.g., $H_2SO_4:H_2O_2:H_2O$ of volumetric ratio 1:8:500) to remove the appropriate portion of the layer 112. For this composition of etch chemistry, the GaAs etch rate has been determined to be on the order of 10 Angstroms per second at room temperature and the ratio of GaAs to $In_{0.5}Ga_{0.5}P$ etch rates is on the order of 150. $In_xGa_{1-x}As_yP_{1-y}$ generally provides a higher etch resistivity than $In_{0.5}Ga_{0.5}P$.

While it is clear that the above chemistry is exemplary, it is of interest to note that other chemistries are clearly possible. To this end, the quaternary etch-stop material 110 generally assures that the etching of the layer 112 proceeds at a much faster rate than that of the layer 110. By selecting the appropriate chemistry and thereby assuring an appropriate ratio of etch rates of the etch-stop layer 110 to that of the layer 112, a relatively uniform recess etch depth may be obtained across the wafer. The across-wafer uniformity of the gate-to-channel dimension is now determined by the uniformity of epitaxial layer 108.

The use of the $In_xGa_{1-x}As_yP_{1-y}$ quaternary etch-stop layer 110 instead of $In_xGa_{1-x}P$ generally results in improved chemical resistivity. For example, etch chemistries are available that etch $In_xGa_{1-x}P$ at a finite rate but exhibit a relatively negligible etch rate for the underlying GaAs layer or effectively an infinite selectivity. An example of a wet etch chemistry that exhibits a high $In_{0.5}Ga_{0.5}P$ etch rate (e.g., on the order of 1 micron per min.), where as no discernable GaAs etch rate has been observed, is HCl in the absence of oxidizing chemistry components such as hydrogen peroxide ($H_2O_2$) or nitric acid ($HNO_3$). Hence the selectivity ratio is virtually infinite. By contrast, the best selectivity realized to date for GaAs over $In_xGa_{1-x}P$ have been limited to on the order of 150. An example of such a wet chemistry is the $HCl:H_3PO_4:H_2O$ system. The $In_xGa_{1-x}As_yP_{1-y}$ quaternary etch-stop layer 110 generally provides increased chemical resistivity to etching with the wet chemistry of the $HCl:H_3PO_4:H_2O$ system.

With the quaternary etch-stop layer 110 inserted at the proper depth, the chemistry, which etches GaAs at a higher rate when compared to the $In_xGa_{1-x}P$ etch rate, may be used to form the recess two region 502. In a preferred embodiment of the present disclosure, the selective chemistry of $H_2SO_4:H_2O_2:H_2O$ of volumetric ratio 1:8:500 may be used. However, other chemistries are clearly possible. The quaternary etch-stop material is generally selected to assure that the etching of the layer 112 proceeds at a much faster rate than that of the layer 110. By selecting the appropriate chemistry and thereby assuring an appropriate ratio of etch rates of the quaternary etch-stop layer 110 to that of the layer 112, a relatively uniform recess etch depth may be obtained across the wafer. Furthermore, the across-wafer uniformity of the gate-to-channel dimension is generally determined by the uniformity of the epitaxial layer 108.

Figure 6:
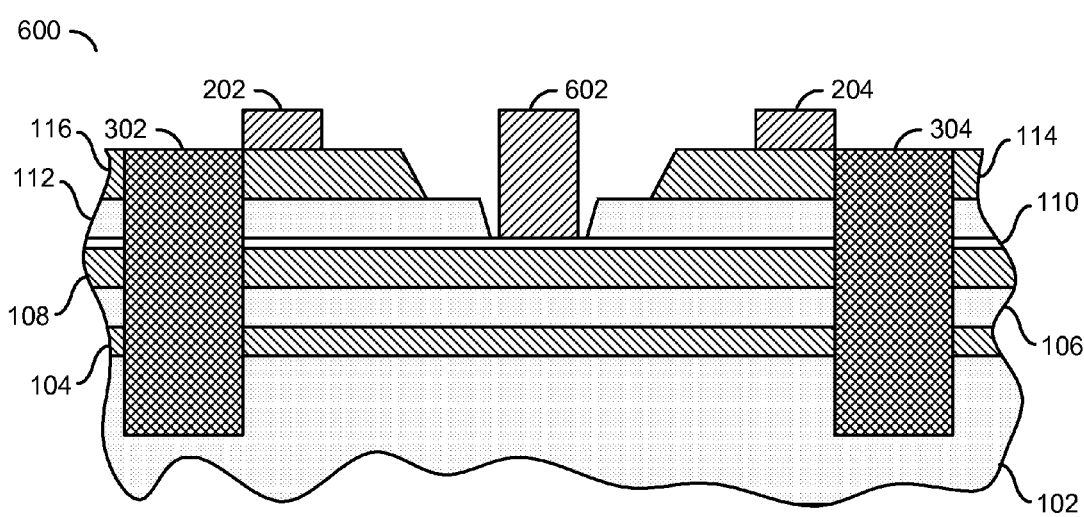
FIG. 6 is a diagram illustrating the semiconductor wafer after formation of a gate electrode of the device.

Referring to FIG. 6, a diagram is shown illustrating a cross section 600 of the semiconductor wafer of FIG. 5 after formation of a gate electrode 602 of the device. After the etching of the layer 112 to the quaternary etch-stop layer 110 is complete, the gate electrode 602 may be fabricated through deposition techniques well known to one of ordinary skill in the art. For example, using the same lithographic layer used for recess definition, a Schottky contact may be deposited on the quaternary etch-stop layer 110, and then the photoresist and unwanted metallization deposited thereon may be lifted off. A typical gate electrode stack may be formed, in one example, of titanium platinum gold (TiPtAu). Following formation of the gate electrode 602, the device may be passivated with a dielectric such as silicon nitride (SiN) and connected with other circuit elements via additional layers of metallization.

Figure 7:
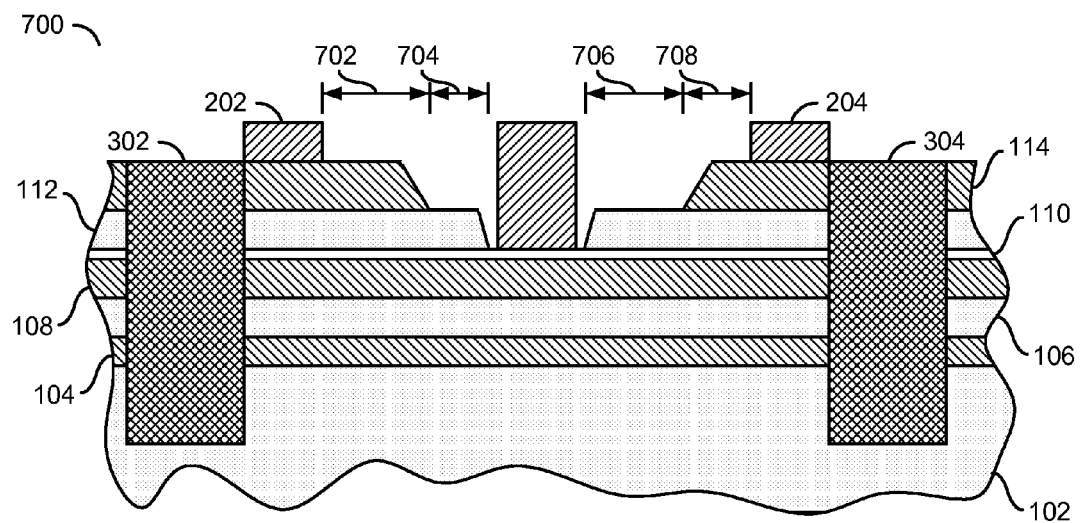
FIG. 7 is a diagram illustrating an alternative embodiment in which a recess one region is asymmetrical about a gate electrode.

Referring to FIG. 7, a diagram is shown illustrating a cross section 700 of a semiconductor wafer similar to that of FIG. 6 with an alternative recess one region having asymmetrical dimensions. In one example, a surface of the layer 114 between the source electrode 202 and the gate electrode may have a dimension 702, an exposed surface of the layer 112 between the source electrode 202 and the gate electrode may have a dimension 704, an exposed surface of the layer 112 between the gate electrode and the drain electrode 204 may have a dimension 706, and a surface of the layer 114 between the gate electrode and the drain electrode 204 may have a dimension 708. The dimensions 702 and 708 may be similar or different. The dimensions 704 and 706 may be similar or different.

Figure 8:
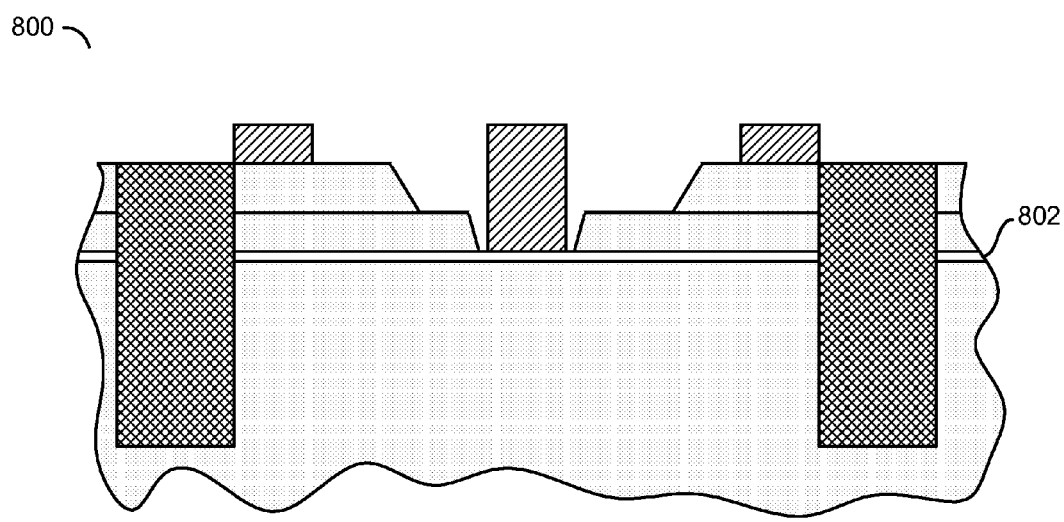
FIG. 8 is a diagram illustrating an alternative embodiment in which a quaternary etch-stop layer in accordance with the present invention is disposed within a device made entirely of GaAs.

Referring to FIG. 8, a diagram is shown illustrating a cross section 800 of a semiconductor wafer in accordance with another alternative embodiment of the present invention. In one example, a quaternary etch-stop layer in accordance with an embodiment of the present invention may be implemented in a device that is otherwise made up of GaAs.

Figure 9:
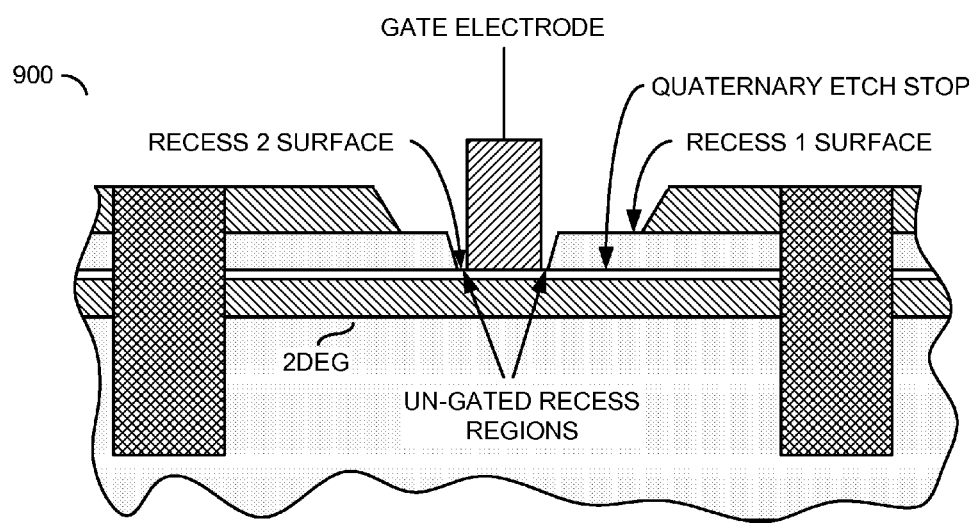
FIG. 9 is a diagram illustrating various structures of an example device in accordance with an embodiment of the present invention.

Referring to FIG. 9, a diagram is shown illustrating an alternative view of a cross section 900 of a device in accordance with an example embodiment of the present invention. A common approach in the realization of pHEMT power devices is the use of a double recess structure (e.g., recess one and recess two regions) to simultaneously realize 1) low access resistance, 2) high breakdown voltage, and 3) high power and efficiency. If the surface of the first recess is etched too deep relative to the top surface (e.g., if the recess one surface is too close to the conduction channel), the surface potential and surface potential variability may substantially degrade the modulation efficiency and hence the drain efficiency of the device. Additionally, it is important to maintain dimensional control of recess two such that the amount of un-gated recess surface (e.g., surface that is not directly covered by the gate electrode) is kept to a minimum and controlled. If the dimension of recess two becomes too large, higher breakdown voltage is realized, but at the expense of drain efficiency.

Figure 10:
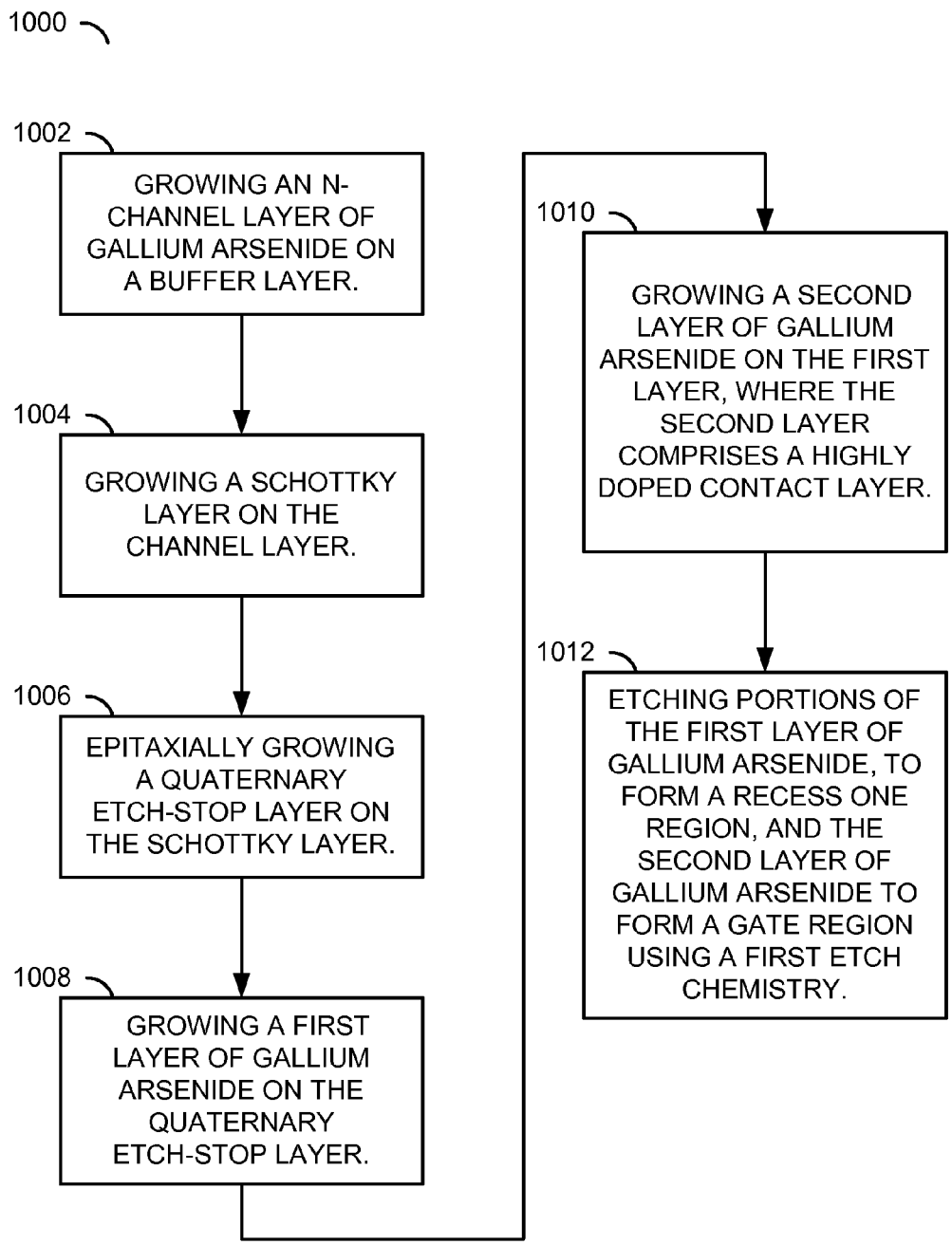
FIG. 10 is flow diagram illustrating a process in accordance with an example embodiment of the present invention.

Referring to FIG. 10, a flow diagram is shown illustrating an example process 1000 in accordance with an example embodiment of the present invention. In one example, the process (or method) 1000 may comprise a step 1002, a step 1004, a step 1006, a step 1008, a step 1010, and a step 1012. The step 1002 may comprise growing an n-channel layer of GaAs on a buffer layer. The step 1004 may comprise growing a barrier layer on the n-channel layer. The step 1006 may comprise epitaxially growing a quaternary etch-stop layer on the barrier layer. The step 1008 may comprise growing a first screening (or contact) layer on the etch-stop layer, where the first screening layer comprises a wide band-gap material (e.g., AlGaAs). The step 1010 may comprise growing a second screening (or contact) layer on the first screening layer, where the second layer comprises a highly doped contact layer (e.g., of GaAs). The step 1012 may comprise etching portions of the second screening layer to form a recess one region and etching portions of the first screening layer to form a region two or gate region. The first and the second screening layers may be etched using, for example, a photolithographic process and chosen first etch chemistry.

While the invention has been particularly shown and described with reference to the preferred embodiments thereof, it will be understood by those skilled in the art that various changes in form and details may be made without departing from the scope of the invention.

The invention claimed is:

1. A process for fabricating a semiconductor device, the process comprising:
    growing an n-channel layer on a buffer layer;
    growing a barrier layer on said n-channel layer;
    epitaxially growing a quaternary etch-stop layer on said barrier layer;
    growing a first contact layer on said quaternary etch-stop layer;
    growing a second contact layer on said first contact layer, said second contact layer being a highly doped contact layer;
    etching portions of said second contact layer to reveal a first recess surface; and
    etching portions of said first contact layer to reveal a second recess surface, said second recess surface forming a gate region, wherein said first and said second contact layers have a first etch rate and said quaternary etch-stop layer has a second etch rate in a chosen first etch chemistry.

2. The process according to claim 1, wherein etching portions of said second contact layer to reveal said first recess surface and etching portions of said first contact layer to reveal said second recess surface further comprise a photolithographic process.

3. The process according to claim 1, wherein said quaternary etch-stop layer comprises $In_xGa_{1-x}As_yP_{1-y}$, where x and y are chosen based on chemical resistivity and barrier height.

4. The process according to claim 3, wherein x is greater than or equal to 0.4 and less than or equal to 0.6.

5. The process according to claim 3, wherein y is greater than zero and less than one.

6. The process according to claim 1, wherein said first etch chemistry is $H_2SO_4:H_2O_2:H_2O$.

7. The process according to claim 1, further comprising:
    depositing and patterning a gate metal layer in said gate region.

8. The process according to claim 1, wherein said quaternary etch-stop layer has a thickness in a range from 10 Angstroms to 50 Angstroms.

9. The process according to claim 1, further comprising:
    opening a window in said first and said second contact layers; and
    depositing a gate metal layer therein, said gate metal making electrical contact with said etch-stop layer.

10. A process for fabricating a field-effect transistor, the process comprising:
    growing an epitaxial buffer layer of unintentionally doped gallium arsenide (GaAs) on a GaAs substrate;
    growing an epitaxial n-channel layer on said buffer layer;
    growing a barrier layer on said n-channel layer;
    growing a quaternary etch-stop layer on said n-channel layer;
    growing a first contact layer on said etch-stop layer;
    growing a second contact layer of GaAs on said first contact layer; and
    selectively etching said second contact layer to form a recess one surface and said first contact layer to form a gate region, wherein said selective etching is affected with a first etch chemistry, said first etch chemistry that etches said first and said second contact layers at a rate substantially faster than said first etch chemistry etches said quaternary etch-stop layer.

11. The process according to claim 10, wherein said first etch chemistry etches said first and said second contact layers at a rate on the order of 150 times faster than said first etch chemistry etches said quaternary etch-stop layer.

12. The process according to claim 10, wherein said quaternary etch-stop layer comprises $In_xGa_{1-x}As_yP_{1-y}$, where x and y are chosen based on chemical resistivity and barrier height.

13. The process according to claim 12, wherein x is greater than or equal to 0.4 and less than or equal to 0.6.

14. The process according to claim 12, wherein y is greater than zero and less than one.

15. The process according to claim 10, wherein said first etch chemistry is $H_2SO_4:H_2O_2:H_2O$.

16. The process according to claim 10, further comprising depositing a gate stack in said gate region.

17. The process according to claim 10, wherein said quaternary etch-stop layer has a thickness in a range from 10 Angstroms to 50 Angstroms.

* * * * *